(12) United States Patent
Ju et al.

(10) Patent No.: US 10,172,249 B1
(45) Date of Patent: Jan. 1, 2019

(54) INTERPOSER ELECTRICAL CONNECTOR FOR A CHIP MODULE

(71) Applicant: LOTES CO., LTD, Keelung (TW)

(72) Inventors: Ted Ju, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/869,624

(22) Filed: Jan. 12, 2018

(30) Foreign Application Priority Data

Jun. 23, 2017 (CN) .......................... 2017 1 0487265
Jun. 28, 2017 (CN) .......................... 2017 1 0506386

(51) Int. Cl.
| | |
|---|---|
| H01R 12/52 | (2011.01) |
| H05K 7/10 | (2006.01) |
| H01R 12/71 | (2011.01) |
| H01R 13/40 | (2006.01) |
| H01R 13/502 | (2006.01) |
| H01R 13/24 | (2006.01) |
| H01R 43/24 | (2006.01) |
| H01R 13/514 | (2006.01) |

(52) U.S. Cl.
CPC ........... *H05K 7/1061* (2013.01); *H01R 12/52* (2013.01); *H01R 12/714* (2013.01); *H01R 12/716* (2013.01); *H01R 13/2464* (2013.01); *H01R 13/40* (2013.01); *H01R 13/502* (2013.01); *H01R 43/24* (2013.01); *H01R 13/514* (2013.01)

(58) Field of Classification Search
CPC ...... H01R 12/52; H01R 12/55; H01R 12/585; H01R 12/712; H01R 43/18; H01R 13/22; H01R 13/2492; H05K 2201/10378; H05K 3/3436; H01L 21/565; H01L 21/566; Y10T 29/49126; Y10T 29/49222; Y10T 29/4922

See application file for complete search history.

(56) References Cited

U.S. PATENT DOCUMENTS

| | | | |
|---|---|---|---|
| 7,377,792 B2* | 5/2008 | Ma .......................... | H01R 13/41 439/71 |
| 7,692,281 B2* | 4/2010 | McAlonis .......... | H01R 13/2442 257/668 |
| 8,192,206 B1* | 6/2012 | Ju .......................... | H01R 12/57 439/66 |

(Continued)

*Primary Examiner* — Vanessa Girardi
(74) *Attorney, Agent, or Firm* — Locke Lord LLP; Tim Tingkang Xia, Esq.

(57) ABSTRACT

An electrical connector for electrically connecting a chip module, including an insulating body provided with multiple accommodating grooves in multiple rows and vertically passing through the insulating body. Each two adjacent accommodating grooves are provided with a partition or a space above the partition. The insulating body is concavely provided downward with at least one groove correspondingly located on the partition or in the space above the partition. The groove has a bottom surface and a side surface being closed and formed by extending upward from a periphery of the bottom surface, and the groove is configured for a pushing pin to push and eject the insulating body from a mold. The insulating body is protrudingly provided upward with a plurality of protruding blocks, configured to support the chip module. The groove and all the protruding blocks are not located on the same partition.

11 Claims, 7 Drawing Sheets

(56) References Cited

U.S. PATENT DOCUMENTS

| | | | | |
|---|---|---|---|---|
| 8,246,360 B1* | 8/2012 | Tsai | ................ | H01R 12/55 |
| | | | | 439/66 |
| 8,708,716 B1* | 4/2014 | Ho | ................ | H01R 12/714 |
| | | | | 439/83 |
| 8,894,422 B2* | 11/2014 | Yeh | ................ | H01R 12/57 |
| | | | | 439/83 |

* cited by examiner

INTERPOSER ELECTRICAL CONNECTOR FOR A CHIP MODULE

CROSS-REFERENCE TO RELATED PATENT APPLICATION

This application claims priority to and the benefit of, pursuant to 35 U.S.C. § 119(a), Patent Application Serial No. CN201710487265.2 filed in P.R. China on Jun. 23, 2017, and Patent Application Serial No. CN201710506386.7 filed in P.R. China on Jun. 28, 2017. The entire contents of the above-identified applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to an electrical connector, and more particularly to an electrical connector for electrically connecting a chip module to a circuit board.

BACKGROUND

An existing electrical connector for connecting a chip module to a circuit board includes an insulating body. The insulating body is provided with multiple accommodating grooves passing through the surface thereof, and multiple terminals are retained in the accommodating grooves. One end of each terminal abuts against the chip module, and the other end is soldered to the circuit board, thereby achieving electrical conduction of the chip module and the circuit board. A partition is included between the adjacent accommodating grooves, and a protruding block is formed by protruding upwards from the partition. In use, the chip module is mounted onto the electrical connector, and then a downward acting force is applied to the chip module, such that the chip module downward abuts the terminals to ensure good contact of the chip module with the terminals. Since the protruding block upward supports the chip module, it can be avoided that the chip module is crushed and it is prevented that the terminals are deformed excessively when pressed. During the molding of the insulating body, the insulating body is injection molded in a mol. After completion of the injection molding, the insulating body needs to be separated from the mold. Therefore, multiple grooves are disposed on the partition, allowing people to use a pushing pin to push in the groove to separate the insulating body from the mold. However, the surface of the partition needs to be provided with the protruding blocks and the grooves spaced apart, thereby causing an excessively large surface area of the partition, resulting in a larger interval between the terminals, and hindering the development of terminal intensification of the electrical connector.

Therefore, a heretofore unaddressed need to design an improved electrical connector exists in the art to address the aforementioned deficiencies and inadequacies.

SUMMARY

In view of the problems in the related art, an objective of the present invention is directed to an electrical connector which facilitates the development of terminal intensification.

To achieve the foregoing objective, one aspect of the invention provides an electrical connector, which includes: an insulating body, provided with a plurality of accommodating grooves in multiple rows and vertically passing through the insulating body, wherein: each two adjacent ones of the accommodating grooves are provided with a partition or a space above the partition; the insulating body is concavely provided downward with at least one groove correspondingly located on the partitions or in the space above the partition, the groove has a bottom surface and a side surface being closed and formed by extending upward from a periphery of the bottom surface, and the groove is configured for a pushing pin to push and eject the insulating body from a mold; and the insulating body is protrudingly provided upward with a plurality of protruding blocks, configured to support the chip module, wherein the at least one groove and all of the protruding blocks spaced apart from the groove are not located on a same one of the partitions; and a plurality of terminals, correspondingly accommodated in the accommodating grooves and configured to conductively connected with the chip module.

In certain embodiments, a plurality of the grooves and the protruding blocks are arranged in a matrix altogether.

In certain embodiments, the at least one groove is concavely formed downward from an upper surface of the partition.

In certain embodiments, the at least one groove is higher than an upper surface of the partition, and a supporting surface is connected to a top end of the side surface for supporting the chip module.

In certain embodiments, each of the at least one groove is correspondingly located between two protruding blocks.

In certain embodiments, each of the protruding blocks has a supporting surface for supporting the chip module, each of the supporting surface and the bottom surface is in a rectangular shape, and an area of the supporting surface is greater than an area of the bottom surface.

In certain embodiments, long sides of the supporting surface are parallel to long sides of the bottom surface, and short sides of the supporting surface are parallel to short sides of the bottom surface.

In certain embodiments, the number of the at least one groove is smaller than the number of the protruding blocks.

In certain embodiments, the number of the at least one groove is less than half of the number of the protruding blocks.

In certain embodiments, each of the terminals is formed by punching a metal plate, and has a base retained in the accommodating grooves and an elastic arm formed by bending and extending upward from the base, configured to abut against the chip module, and wherein each of the protruding blocks faces a plate surface of the elastic arm.

In certain embodiments, a strip connecting portion is formed by extending vertically upward from one side of the base, configured to connect a material strip, and wherein the at least one groove is located between the elastic arm and the strip connecting portion adjacent to each other.

Compared with the related art, the electrical connector according to certain embodiments of the invention has the following beneficial effects. In the electrical connector, the insulating body is concavely provided downward with at least one groove correspondingly located on the partition or in the space above the partition, and the groove and all the protruding blocks spaced apart from the groove are not located on the same one of the partitions, such that it is unnecessary that one of the partitions is simultaneously provided with the grooves and the protruding blocks spaced apart, thereby decreasing a surface area of each partition, further reducing an interval between the terminals, and facilitating an intensive design of the terminals of the electrical connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

DETAILED DESCRIPTION

Figure 1:
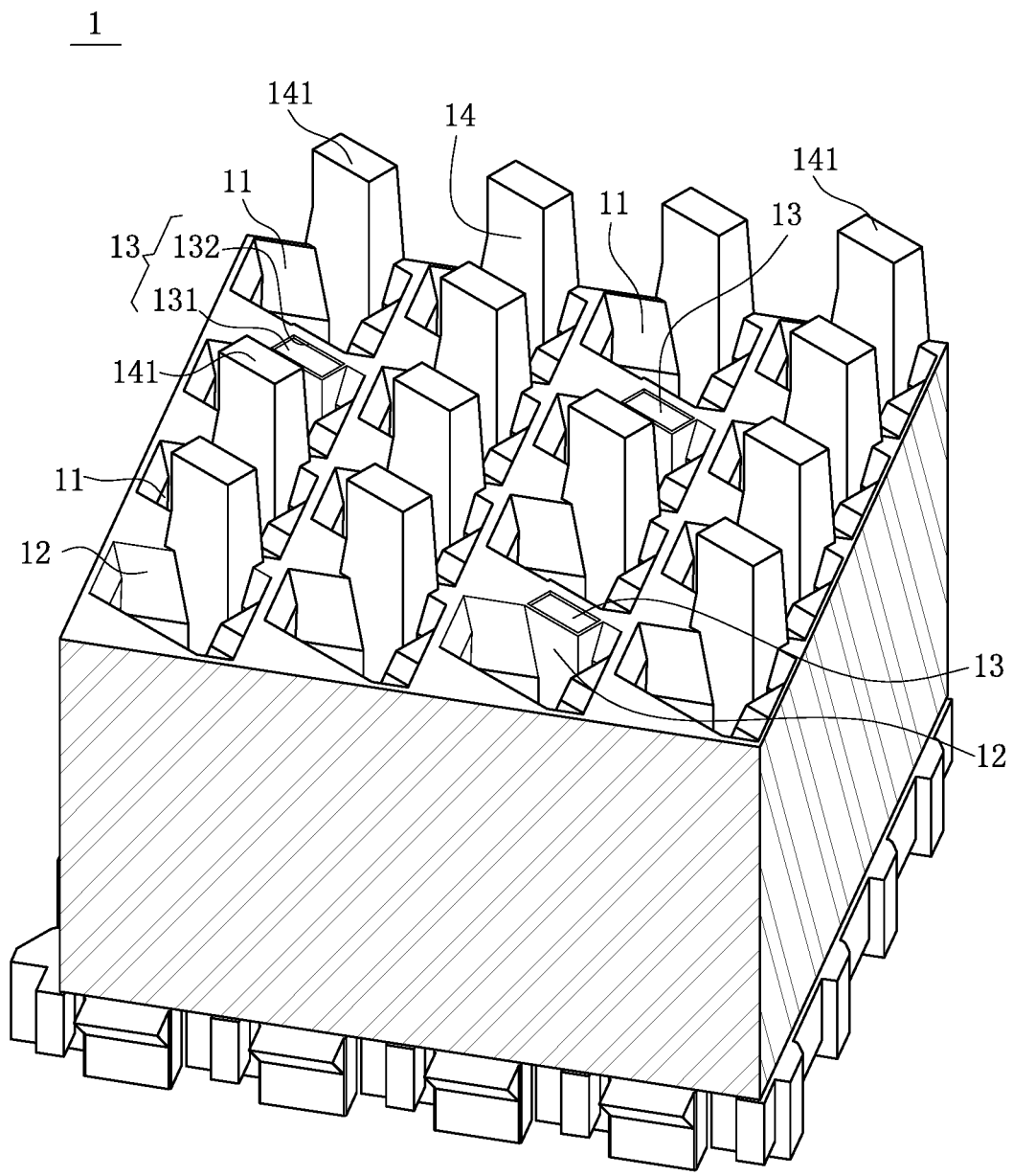
FIG. 1 is a schematic perspective view of an insulating body according to a first embodiment of an electrical connector of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to an electrical connector.

Figure 5:
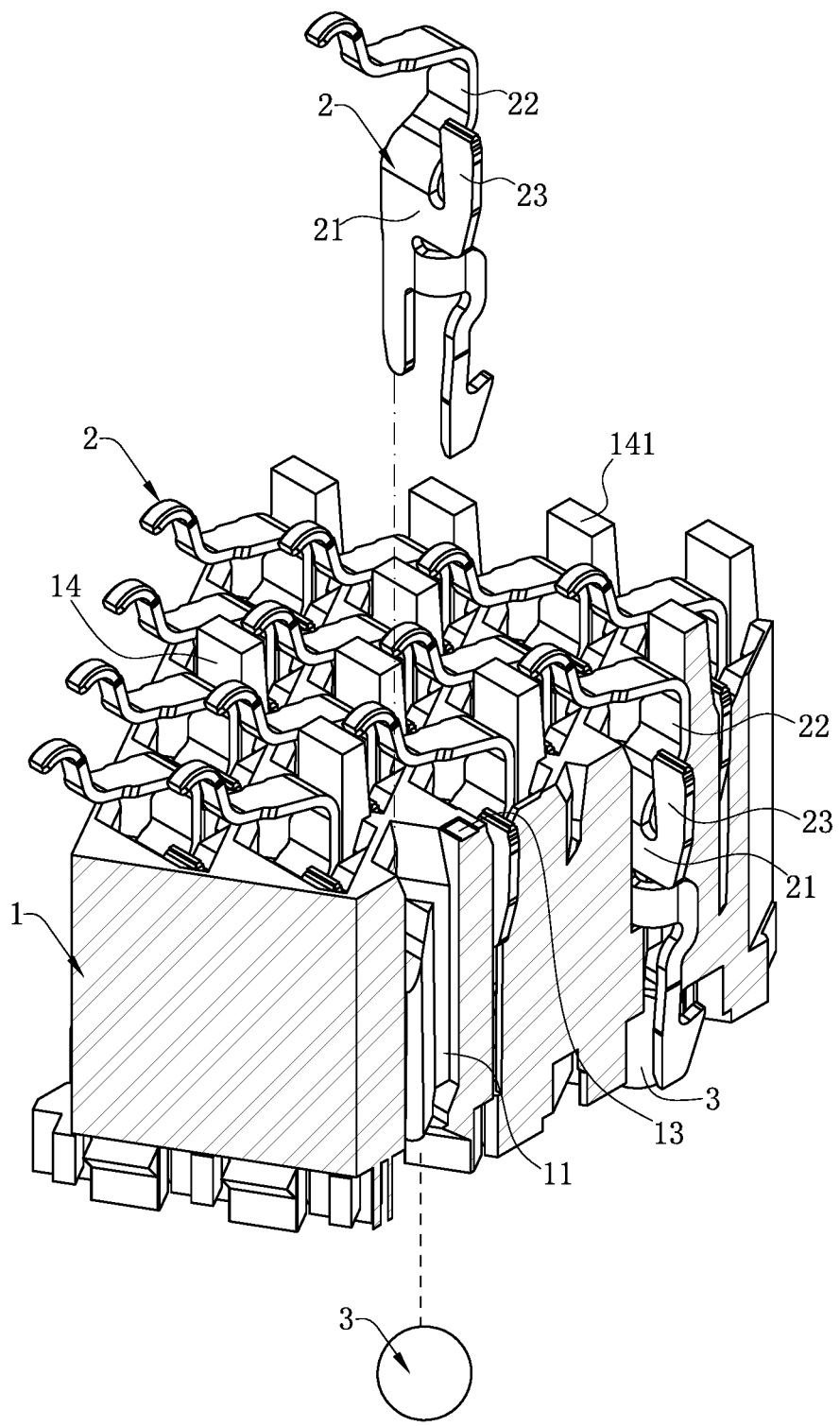
FIG. 5 is a partial schematic perspective exploded view of the electrical connector according to the first embodiment of the present invention.
Figure 6:
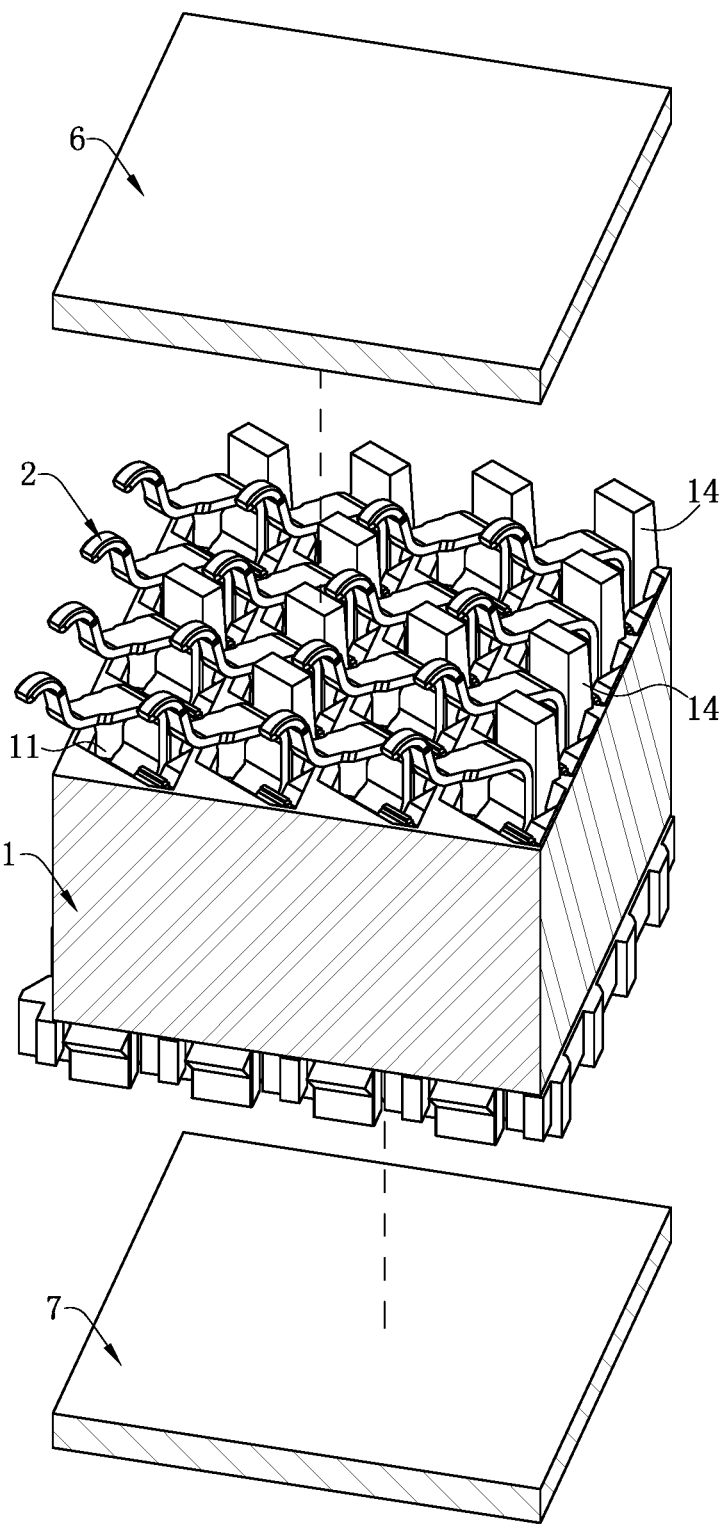
FIG. 6 is a schematic perspective view of the electrical connector before assembling a chip module and a circuit board according to the first embodiment of the present invention.

As shown in FIGS. 5 and 6, an electrical connector 100 according to the embodiment of the present invention is used to electrically connect a chip module 6 to a circuit board 7, and includes an insulating body 1 (only part of the insulating body 1 is drawn in the figures, similarly hereinafter); and multiple terminals 2 retained in the insulating body 1. One end of each terminal 2 is conductively connected to the circuit board 7, and the other end is soldered to the circuit board 7 by a solder ball 3.

As shown in FIG. 1, FIG. 5 and FIG. 6, the electrical connector 100 according to a first embodiment of the present invention is illustrated. In the present embodiment, the terminals 2 are formed by punching and bending a metal plate, and each terminal 2 has a base 21. An elastic arm 22 is formed by bending and extending upward from the base 21. The elastic arm 22 extends out of the insulating body 1 and upward abuts the chip module 6. A strip connecting portion 23 is formed by extending vertically upward from one side of the base 21, and a top end of the strip connecting portion 23 is used to connect one material strip (not shown).

Figure 2:
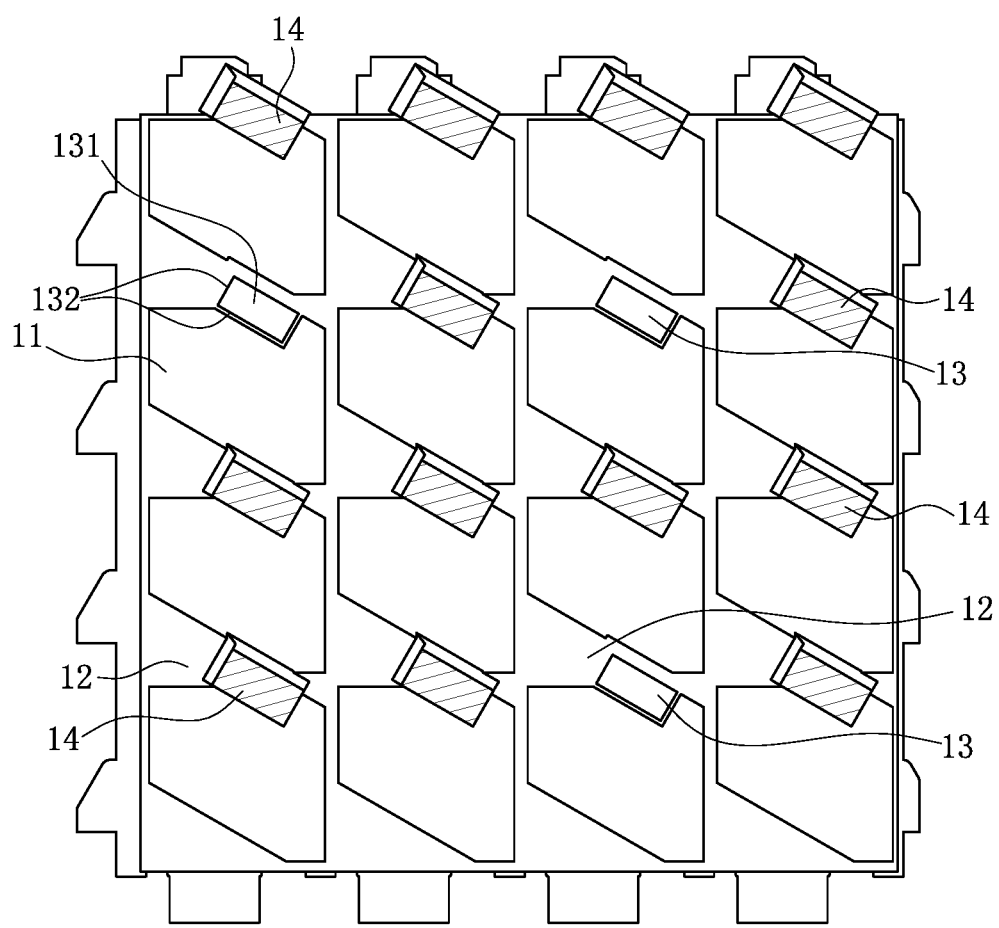
FIG. 2 is a schematic top view of the insulating body of the electrical connector according to the first embodiment of the present invention.
Figure 3:
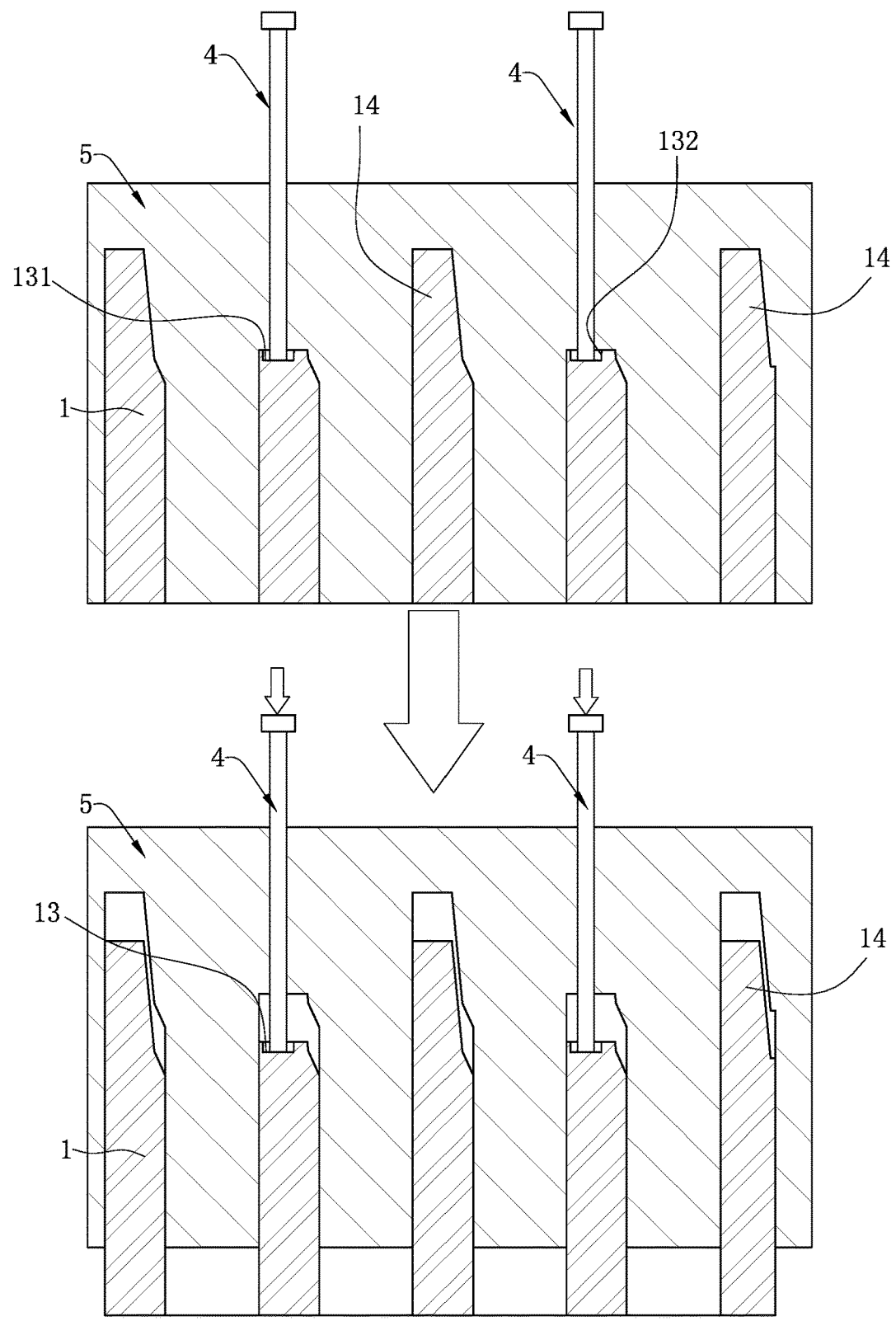
FIG. 3 is a schematic view of a demolding process of the insulating body of the electrical connector according to the first embodiment of the present invention.
Figure 4:
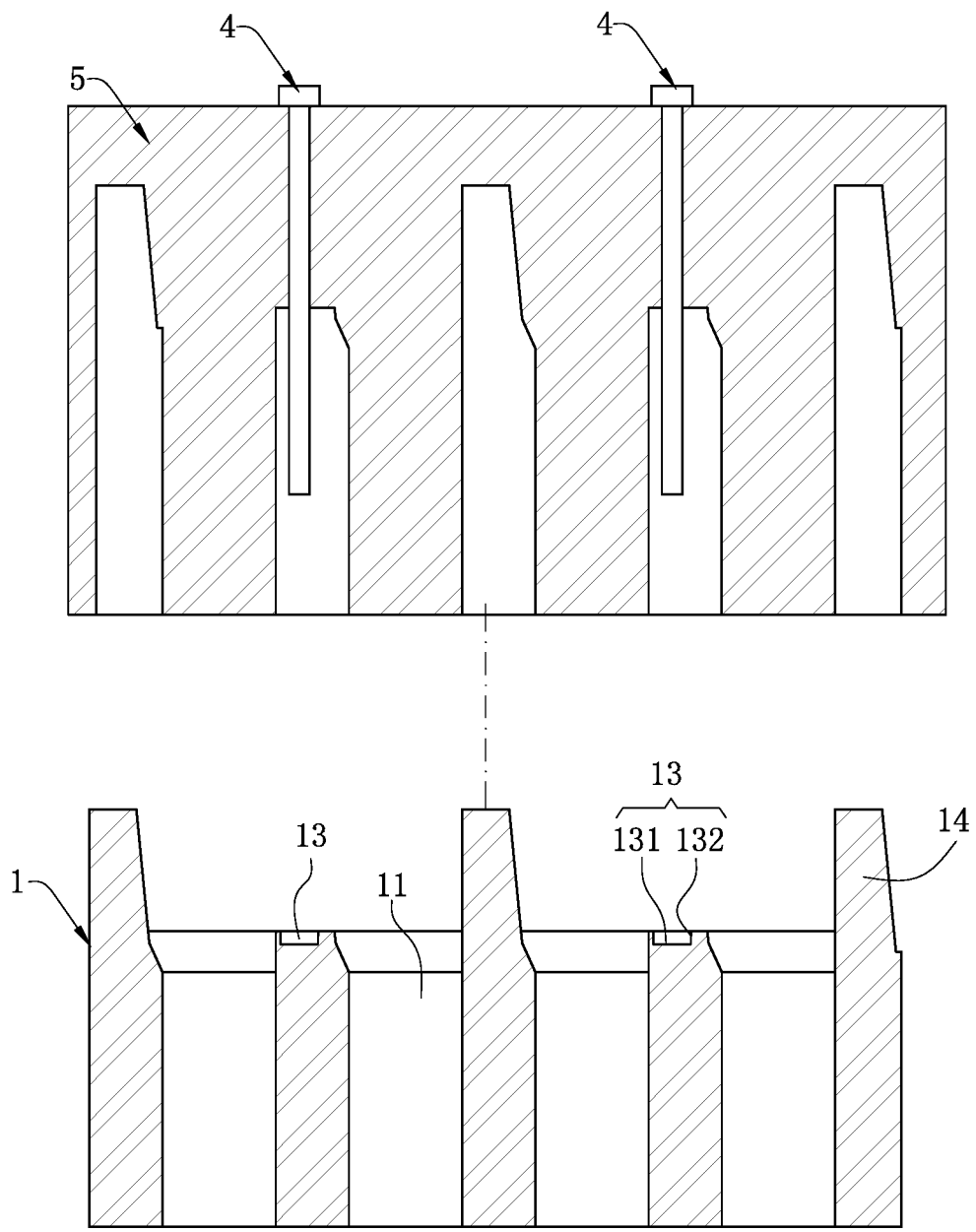
FIG. 4 is a schematic view of the completely demolded insulating body of the electrical connector according to the first embodiment of the present invention.

As shown in FIG. 1 to FIG. 3, the insulating body 1 is provided with multiple accommodating grooves 11 in multiple rows and vertically passing through the insulating body 1. The bases 21 are retained in the accommodating grooves 11, such that the terminals 2 are arranged in a matrix in the insulating body 1. The insulating body 1 forms a partition 12 between each two adjacent accommodating grooves 11. Among the multiple partitions 12, an upper surface of each of a part of the partitions 12 are concavely formed downward with a groove 13. Each of the groove 13 is configured for a pushing pin 4 to push eject the insulating body 1 from a mold 5. The remaining partitions 12 which do not form the grooves 13 thereon protrude upward to form multiple protruding blocks 14. As shown in FIG. 6, the protruding blocks 14 are configured to support the chip module 6. With such an arrangement, each of the partitions 12 is not provided with the groove 13 and the protruding block 14 simultaneously, thereby decreasing an area of the upper surface of each partition 12, further reducing a distance between the terminals 2, and facilitating an intensive design of the terminals 2 of the electrical connector 100. Further, as shown in FIG. 4, the multiple grooves 13 and the multiple protruding blocks 14 are arranged in a matrix altogether, such that the grooves 13 and the protruding blocks 14 are uniformly distributed on the upper surface of the insulating body 1. It should be particularly noted that edges of the matrix formed by the grooves 13 and the protruding blocks 14 are one-to-one corresponding to edges of a matrix formed by the terminals 2, and lengths of the edges are substantially the same. Each groove 13 is located between two protruding blocks 14. That is, each two grooves 13 are not adjacent, such that the pushing forces of the pushing pins 4 on the insulating body 1 are dispersed, thereby avoiding the insulating body 1 to be destroyed due to stress concentration during demolding. Furthermore, since demolding of the insulating body 1 does not need a huge force and only needs uniform force bearing points, the number of the grooves 13 can be suitably decreased, allowing more partitions 12 to protruding form the protruding blocks 14 thereon, thereby increasing the number of the protruding blocks 14 and ensuring the supporting force onto the chip module 6. In the present embodiment, in order to achieve such a balance, the number of the grooves 13 is less than half of the number of the protruding blocks 14, thereby avoiding the excessive number of grooves 13 to cause the number of the protruding blocks 14 to be few.

Each protruding block 14 is provided with a supporting surface 141 for supporting the chip module 6. The supporting surface 141 is in a rectangular shape. The groove 13 has a bottom surface 131 and a side surface 132 that is closed and formed by extending upward from a periphery of the bottom surface 131. The bottom surface 131 is in a rectangular shape as well. An area of the supporting surface 141 is greater than an area of the bottom surface 131. Long sides of the supporting surface 141 are parallel to longs sides of the bottom surface 131, and short sides of the supporting surface 141 are parallel to short sides of the bottom surface 131, such that all the grooves 13 and the protruding blocks 14 are distributed more uniformly on the upper surface of the insulating body 1, thereby increasing stability of the insulating body 1. Further, each protruding block 14 faces a plate surface of the elastic arm 22, and each groove 13 is located between the elastic arm 22 and the strip connecting portion 23 adjacent to each other.

Figure 7:
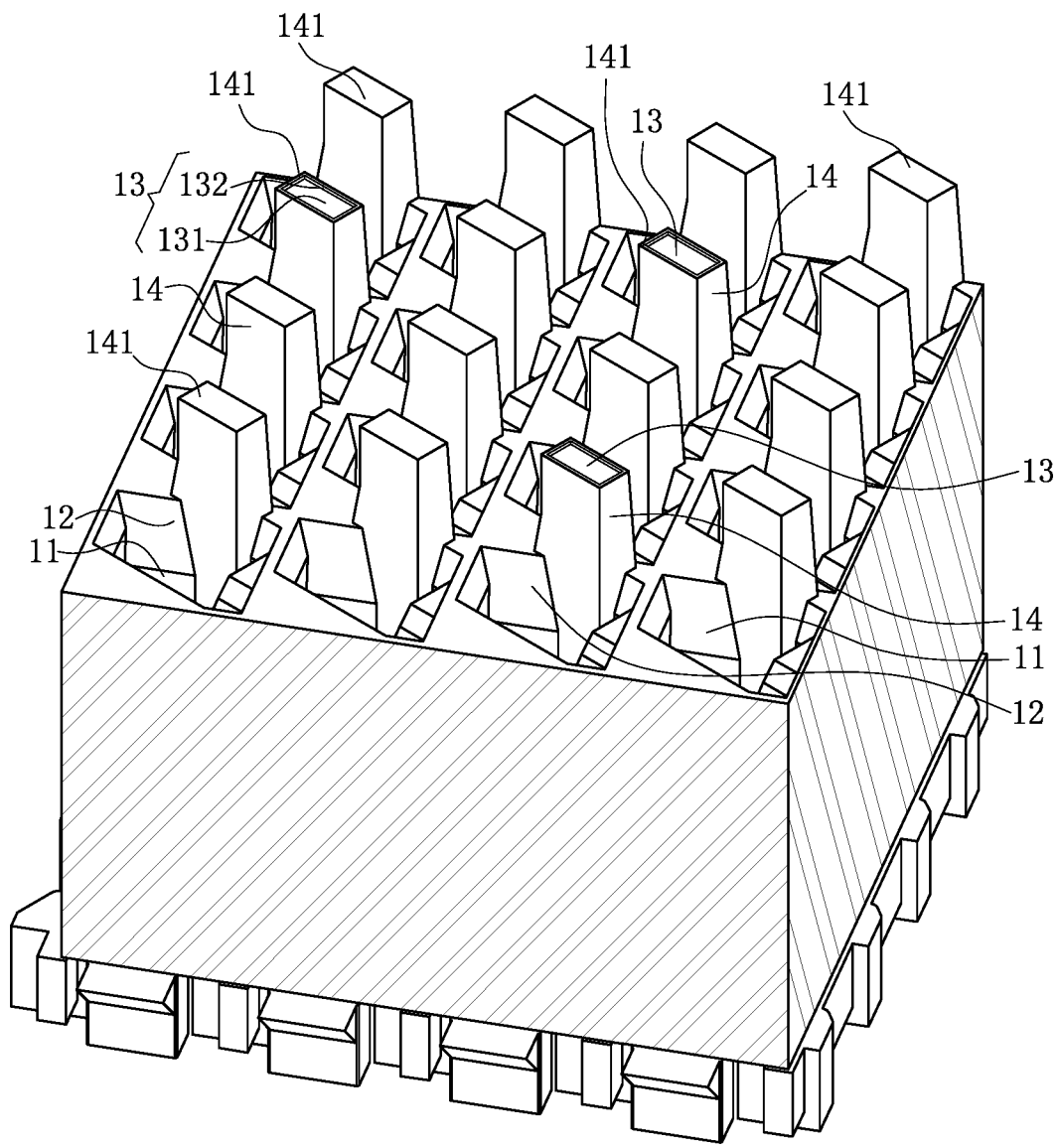
FIG. 7 is a schematic perspective view of an insulating body of an electrical connector according to a second embodiment of the present invention.

As shown in FIG. 7, the insulating body 1 of the electrical connector according to a second embodiment of the present invention is illustrated. The main differences between the present embodiment and the first embodiment exist in that each groove 13 is located right above the partition 12 (also referred as a space above the partition 12). That is, the upper surface of each partition 12 is not concavely provided with the groove 13. Instead, each groove 13 is concavely formed downward from a top surface of one of the protruding blocks 14. That is, the supporting surface 141 is connected to the top end of the side surface 132, such that the groove 13 is higher than the upper surface of the partition 12. With such an arrangement, the groove 13 does not occupy the area of the upper surface of one partition 12 by itself at all. That is, the grooves 13 and the protruding blocks 14 share the area of one partition 12, thereby ensuring the number of the protruding blocks 14, decreasing the area of the upper surface of each partition 12, and reducing the distance between the terminals 2. Other structures of the present embodiment are the same as those of the first embodiment, and are not elaborated herein.

To sum up, the electrical connector 100 according to certain embodiments of the present invention has the following advantageous beneficial effects.

(1) The insulating body 1 is concavely provided downward with the groove 13 correspondingly located on the partition 12 or in the partition-above space above the partition, and the groove 13 and all the protruding blocks 14 spaced apart from the groove 13 are not located on the same partition, such that one of the partitions 12 is not simultaneously provided with the grooves 13 and the protruding blocks 14 spaced apart, thereby decreasing a surface area of the partition 12, further reducing an interval between the terminals 2, and facilitating an intensive design of the terminals 2 of the electrical connector 100.

(2) The upper surface of the partition 12 is not concavely provided with the groove 13. Instead, each groove 13 is concavely formed downward from a top surface of one of the protruding blocks 14, such that the groove 13 does not occupy an area of the upper surface of the partition 12 by itself at all, and all the partitions 12 can protrudingly extend to form the protruding blocks 14, thereby ensuring the number of the protruding blocks 14, decreasing the area of the upper surface of each partition 12, and reducing a distance between the terminals 2.

The above detailed description only describes preferable embodiments of the present invention, and is not intended to limit the patent scope of the present invention, so any equivalent technical changes made by use of the specification of the creation and the content shown in the drawings all fall within the patent scope of the present invention.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module, comprising:
   an insulating body, provided with a plurality of accommodating grooves in multiple rows and vertically passing through the insulating body, wherein:
      each two adjacent ones of the accommodating grooves are provided with a partition or a space above the partition;
      the insulating body is concavely provided downward with at least one groove correspondingly located on the partitions or in the space above the partition, the groove has a bottom surface and a side surface being closed and formed by extending upward from a periphery of the bottom surface, and the groove is configured for a pushing pin to push and eject the insulating body from a mold; and the insulating body is protrudingly provided upward with a plurality of protruding blocks, configured to support the chip module, wherein the at least one groove and all of the protruding blocks spaced apart from the groove are not located on a same one of the partitions; and a plurality of terminals, correspondingly accommodated in the accommodating grooves and configured to conductively connected with the chip module.

2. The electrical connector according to claim 1, wherein a plurality of the grooves and the protruding blocks are arranged in a matrix altogether.

3. The electrical connector according to claim 1, wherein the at least one groove is concavely formed downward from an upper surface of the partition.

4. The electrical connector according to claim 1, wherein the at least one groove is higher than an upper surface of the partition, and a supporting surface is connected to a top end of the side surface for supporting the chip module.

5. The electrical connector according to claim 1, wherein each of the at least one groove is correspondingly located between two protruding blocks.

6. The electrical connector according to claim 1, wherein each of the protruding blocks has a supporting surface for supporting the chip module, each of the supporting surface and the bottom surface is in a rectangular shape, and an area of the supporting surface is greater than an area of the bottom surface.

7. The electrical connector according to claim 6, wherein long sides of the supporting surface are parallel to long sides of the bottom surface, and short sides of the supporting surface are parallel to short sides of the bottom surface.

8. The electrical connector according to claim 1, wherein the number of the at least one groove is smaller than the number of the protruding blocks.

9. The electrical connector according to claim 8, wherein the number of the at least one groove is less than half of the number of the protruding blocks.

10. The electrical connector according to claim 8, wherein each of the terminals is formed by punching a metal plate, and has a base retained in the accommodating grooves and an elastic arm formed by bending and extending upward from the base, configured to abut against the chip module, and wherein each of the protruding blocks faces a plate surface of the elastic arm.

11. The electrical connector according to claim 10, wherein a strip connecting portion is formed by extending vertically upward from one side of the base, configured to connect a material strip, and wherein the at least one groove is located between the elastic arm and the strip connecting portion adjacent to each other.

\* \* \* \* \*